(12) United States Patent
Mauch et al.

(10) Patent No.: US 12,176,207 B2
(45) Date of Patent: Dec. 24, 2024

(54) METHOD FOR MANUFACTURING A SILICON CARBIDE DEVICE

(71) Applicant: X-FAB Texas, Inc., Lubbock, TX (US)

(72) Inventors: Daniel Mauch, Lubbock, TX (US); Yon Lee, Lubbock, TX (US); John Ransom, Lubbock, TX (US); Stephen Duran, Lubbock, TX (US)

(73) Assignee: X-FAB Texas, Inc., Lubbock, TX (US)

( * ) Notice: Subject to any disclaimer, the term of this patent is extended or adjusted under 35 U.S.C. 154(b) by 0 days.

(21) Appl. No.: 16/855,532

(22) Filed: Apr. 22, 2020

(65) Prior Publication Data

US 2021/0335607 A1  Oct. 28, 2021

(51) Int. Cl.
*H01L 21/00* (2006.01)
*H01L 21/02* (2006.01)
*H01L 29/16* (2006.01)

(52) U.S. Cl.
CPC .. *H01L 21/02345* (2013.01); *H01L 21/02129* (2013.01); *H01L 21/02274* (2013.01); *H01L 29/1608* (2013.01)

(58) Field of Classification Search
CPC ........... H01L 21/02129; H01L 29/1608; H01L 21/02271; H01L 21/02274; H01L 21/02345
See application file for complete search history.

(56) References Cited

U.S. PATENT DOCUMENTS

| | | | | |
|---|---|---|---|---|
| 6,010,948 A * | 1/2000 | Yu | ..................... | H01L 21/76224 257/E21.546 |
| 6,177,344 B1 * | 1/2001 | Xia | .................. | H01L 21/31051 438/646 |
| 7,947,551 B1 * | 5/2011 | Syue | .................. | H01L 21/76224 438/207 |
| 2004/0192009 A1 * | 9/2004 | Belyansky | ........ | H01L 21/76224 438/424 |
| 2013/0295732 A1 * | 11/2013 | Wu | .................... | H01L 21/26513 438/290 |
| 2016/0236930 A1 * | 8/2016 | North | ..................... | B41J 2/1631 |
| 2017/0170062 A1 * | 6/2017 | Murray | ............. | H01L 21/76879 |

(Continued)

FOREIGN PATENT DOCUMENTS

| | | | |
|---|---|---|---|
| CN | 101431047 A | 5/2009 | |
| CN | 105047542 A | 11/2015 | |

(Continued)

OTHER PUBLICATIONS

German Office Action for corresponding German Application No. 102021110164.6, dated Aug. 19, 2022, 9 pages.

(Continued)

*Primary Examiner* — Reema Patel
(74) *Attorney, Agent, or Firm* — Dority & Manning, P.A.

(57) ABSTRACT

A method of forming a semiconductor structure, the method comprises:
 providing a non-planar surface in the manufacturing of a silicon carbide (SiC) device;
 depositing a reflowable dielectric material on said non-planar surface; and
 heating said reflowable dielectric material to a temperature and for a time sufficient to cause reflowing of said reflowable dielectric material and thereby provide a dielectric layer comprising a substantially planar surface, wherein said dielectric layer is substantially free of voids.

9 Claims, 10 Drawing Sheets

(56) References Cited

U.S. PATENT DOCUMENTS

| | | |
|---|---|---|
| 2018/0005869 A1 | 1/2018 | Yu et al. |
| 2018/0096898 A1 | 4/2018 | Yu et al. |
| 2018/0158898 A1* | 6/2018 | Okawa ................ H01L 29/0634 |
| 2020/0109048 A1 | 4/2020 | Lee et al. |

FOREIGN PATENT DOCUMENTS

| | | | |
|---|---|---|---|
| CN | 110473919 A | 11/2019 | |
| DE | 102010028044 | 10/2011 | |
| JP | S6476727 B2 * | 3/1989 | ........... H01L 21/316 |
| JP | H07142463 A | 6/1995 | |
| JP | 2004031923 A | 1/2004 | |
| JP | 2020036045 | 3/2020 | |
| KR | 20070063294 * | 6/2007 | ............. H01L 21/76 |
| WO | WO2006136194 | 12/2006 | |

OTHER PUBLICATIONS

Chinese Office Action (w/ machine translation) for corresponding Application No. 202110439172.9, dated May 31, 2023, 17 pages.
Chinese Office Action (w/ Machine translation) for corresponding Application No. 2021104391729, dated Jun. 28, 2024, 21 pages.

* cited by examiner

METHOD FOR MANUFACTURING A SILICON CARBIDE DEVICE

TECHNICAL FIELD

The present disclosure relates to a method for manufacturing a Silicon Carbide (SiC) device.

BACKGROUND

SiC is an emerging semiconductor material that is well suited for power electronics and electronics that are required to withstand harsh environmental conditions. SIC is a substantively different semiconductor material to Silicon (Si). From a device manufacturing perspective, a critical difference between SiC and Si is the diffusion of dopants in these materials. Dopants do not begin to diffuse substantially in SiC until temperatures exceed approximately 1800 degrees centigrade; in contrast, dopants begin to diffuse in Si when temperatures exceed approximately 750 degrees centigrade.

SUMMARY OF THE INVENTION

The present disclosure provides a method for manufacturing Silicon Carbide devices taking advantage of the large difference in diffusion coefficients between SiC and Si as set out in the accompanying claims.

BRIEF DESCRIPTION OF THE DRAWINGS

Embodiments of the invention will now be described, by way of example only, with reference to the accompanying drawings, in which.

DESCRIPTION OF PREFERRED EMBODIMENTS

Figure 1:
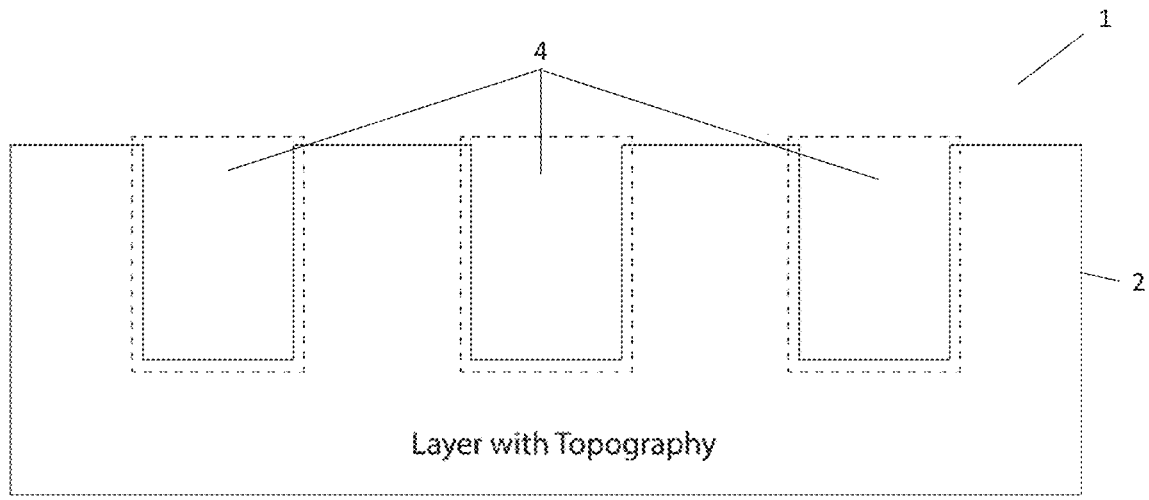
FIG. 1 illustrates the general shape of the surface topography to be filled and planarized.

The difference in the diffusion coefficients of various dopants in Si and SiC described above, i.e. the different temperatures at which dopants diffuse, allows planarization and fill processes to be employed in the manufacture of SiC devices that are not employable in the manufacture of Si devices.

Described herein are methods whereby, through one or more cycles a reflowable dielectric material is deposited upon a non-planar surface (e.g. comprising trenches in a SiC substrate), and through annealing the dielectric and underlying layers at a temperature sufficient to cause reflowing, the reflowable dielectric provides a planar surface above the non-planar topography on the surface of the SiC, which may allow for more manufacturable and higher yielding devices. The non-planar surface topography may be comprised of SiC, or comprised of dielectric films, and/or conductive films on an underlying SiC substrate.

Embodiments described herein may solve the technical problem of filling an underlying topography (non-planar surface) with a dielectric material without voids or seams, and also creating a planar dielectric layer over the non-planar surface. The deposition of a dielectric film has the tendency to create voids and seams, which remain after the deposition. Eliminating these voids and seams is of interest due to the non-uniform etch characteristics voids and seams introduce in the film, and the tendency of voids to trap moisture which can lead to reliability issues. Creating a planar surface atop a non-planar surface is of interest due to the effect this has on subsequent pattern levels. Planar surfaces allow for a greater depth of focus budget during photolithography relative to non-planar surfaces; this subsequently allows for the resolving of features during photolithography atop the planar surface that could not be resolved on the non-planar surface.

The present disclosure provides methods for manufacturing Silicon Carbide devices taking advantage of the large difference in diffusion coefficients between SiC and Si. The technical problems of filling and planarization are solved through one or more cycles of depositing a reflowable dielectric material, and then annealing the reflowable dielectric material at a temperature sufficient to cause reflow. The reflowing of the dielectric can eliminate voids and seams, and cause the surface of the dielectric layer to become planar. Repeating this process in multiple cycles has been found to enhance the filling and planarizing effects of the method. This method is not suitable for Si device processing due to the severe effects this method would have on the distribution of dopants within the Si due to diffusion.

An advantage of embodiments of the method described herein is their ability to be readily implemented with the processing equipment typically used for the fabrication of CMOS technologies including legacy technology nodes (>0.6 um). The capabilities required to implement the present invention are PECVD deposition tools and furnaces. The current state-of-the-art method for fill and planarization is HDPE oxide deposition followed by CMP, these capabilities are found in fabrication facilities tooled for <0.5 um technology nodes. Therefore, the embodiments can achieve the goals of voidless and seamless filling and planarization without requiring the capital investment in CMP capability.

The temperature necessary to cause a reflowable dielectric to reflow is typically in excess of 750 degrees centigrade. Therefore, this feature of the present disclosure cannot be readily applied in the planarization of Si devices, due to the severe effects this method would have on the distribution of dopants within the Si due to diffusion. In contrast, the method described herein can be applied as a means of filling and planarization in the manufacturing of a SiC device without affecting the distribution of dopants within the SiC due to diffusion.

The method may include filling trenches in SiC, or planarizing other non-planar topography atop functional layers such as a SiC epitaxial layer, a prior conductive layer, a prior dielectric layer, or a prior magnetic layer with a reflowable dielectric, and then planarizing the reflowable dielectric. Filling and planarization may be achieved through one or more cycles of depositing a reflowable dielectric, and annealing the reflowable dielectric film and underlying layers at a temperature sufficient to cause the dielectric to reflow. A plurality of anneals may be applied after the first reflowable dielectric deposition and then after each subsequent reflowable dielectric deposition to achieve a planarized surface.

FIG. 1 shows a schematic cross section of a semiconductor structure 1 comprising a layer of the SiC 2 to be filled and planarized. In the present example, there are three trenches 4 to be filled. However, there could be any number of trenches. The surface may also be any surface with a non-planar topography.

Figure 2:
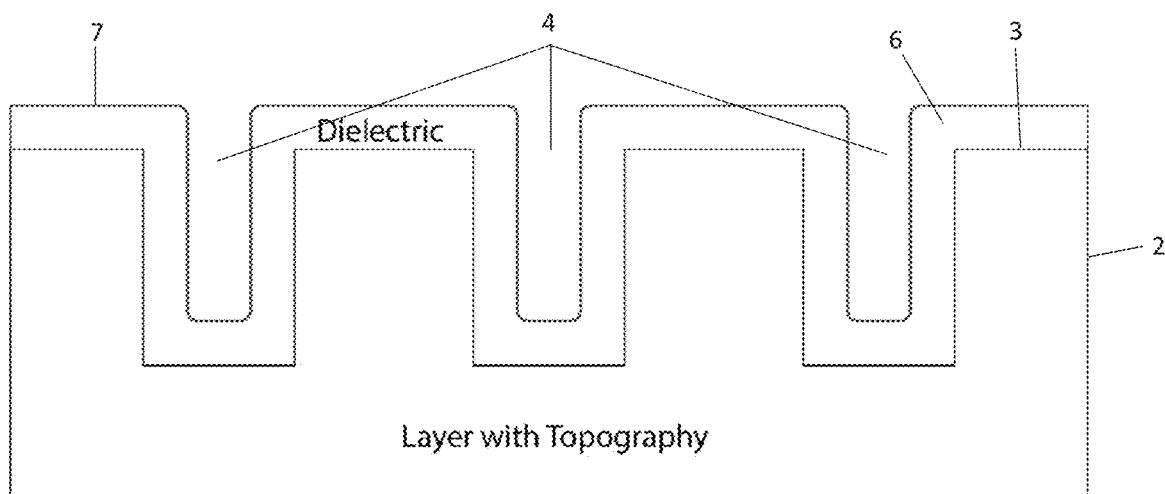
FIG. 2 illustrates the state of the surface following the first deposition of a reflowable dielectric, prior to reflowing.

As shown in FIG. 2, a reflowable dielectric 6 may be deposited upon an upper surface 3 of the SiC 2. This figure shows a cross-sectional view illustrating the state of the surface 7 of the dielectric material 6 after the first deposition of the reflowable dielectric 6 atop the layer of the SiC 2 featuring a non-planar topography.

An example of the reflowable dielectric material is Borophosphosilicate Glass (BPSG). This BPSG may comprise 4 WT % Boron and 4 WT % Phosphorus. However, any reflowable dielectric material, i.e. any dielectric material capable of being formed into a different shape by flowing, may be used. The reflowable dielectric material may be deposited on the non-planar surface using any known deposition method, one known method is to deposit the film by plasma-enhanced chemical vapour deposition (PECVD).

Following the deposition of the reflowable dielectric material 6 upon the surface 3 of the SiC 2, the reflowable dielectric material 6 and underlying layers may be heated at a temperature sufficient to cause reflowing of the reflowable dielectric material 6, so that the reflowable dielectric material 6 fills any trenches 4 or other non-planar topography on the surface of the SiC 2.

Figure 3:
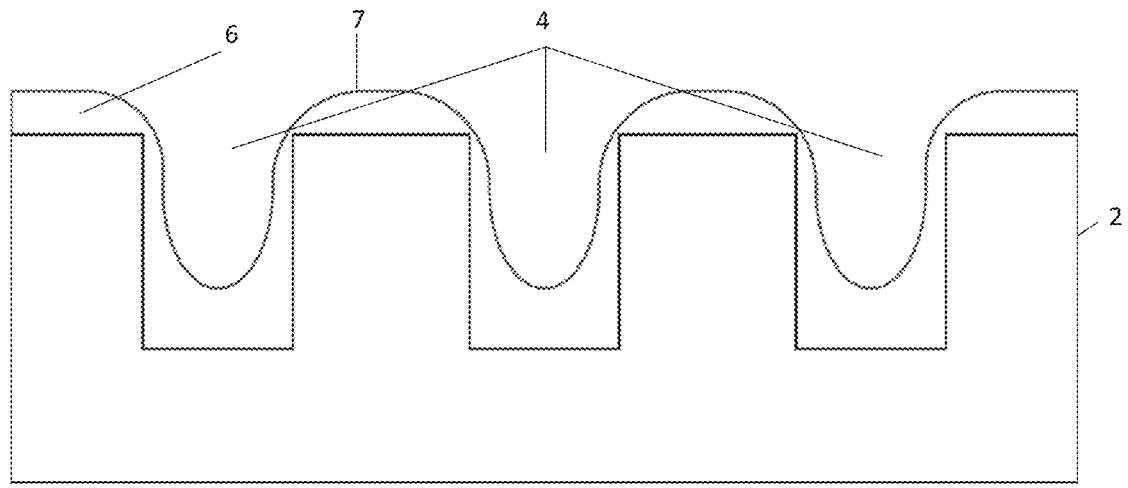
FIG. 3 illustrates the state of the surface following the annealing/reflow of the first layer of reflowable dielectric.

FIG. 3 illustrates the state of the surface 7 following the annealing/reflowing of a first layer of the reflowable dielectric 6. This completes the first cycle of deposition of the dielectric material 6 followed by reflow of the dielectric material 6. An example of the typical reflow conditions would be 950 degrees centigrade for 30 minutes to induce reflow of BPSG. However, the annealing temperature may be anywhere between 750 degrees centigrade and 1350 degrees centigrade. The annealing time, for example, may be between 1 minute and 24 hours.

Figure 4:
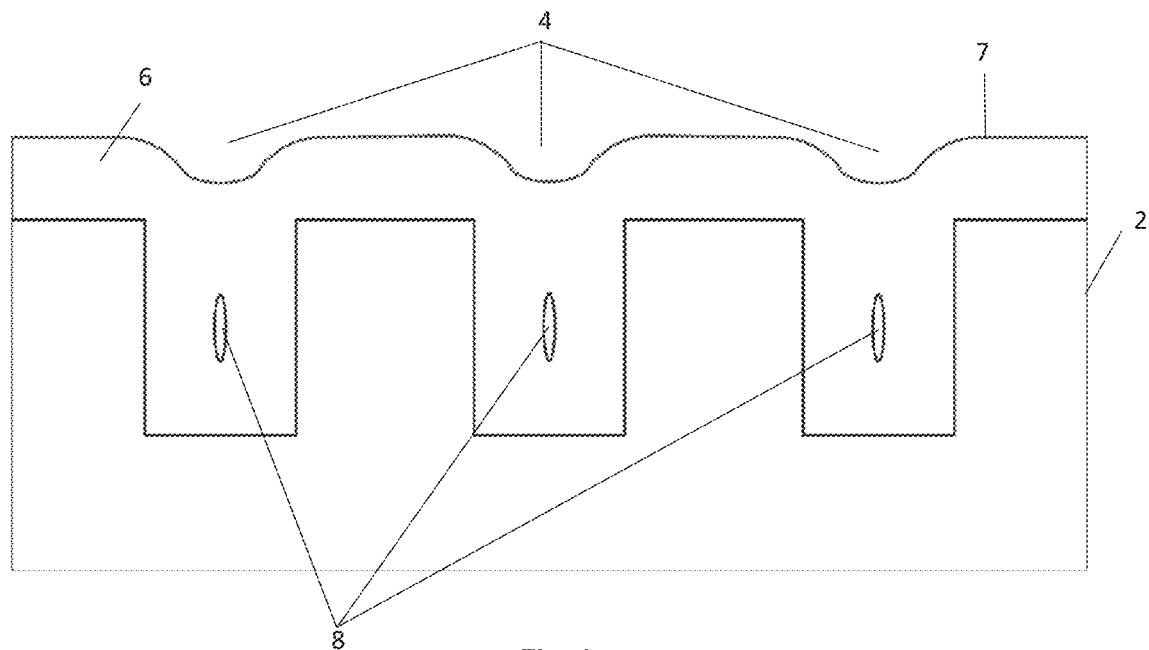
FIG. 4 illustrates the state of the surface following the second deposition of a reflowable dielectric.

As shown in FIG. 4, the process of depositing the dielectric material 6 followed by reflowing the dielectric material 6 may then be repeated. FIG. 4 illustrates the state of the surface 7 of the dielectric 6 following a second deposition of a reflowable dielectric 6. The second cycle is undertaken following the completion of the first cycle of deposition of the dielectric material 6 followed by reflow of the dielectric material 6. The second cycle includes further deposition of the dielectric material 6 followed by reflow of the dielectric material 6. There is no limit to the number of such cycles that can be repeated. As shown in FIG. 4, voids 8 may form in the dielectric material 6, which are subsequently removed (as shown in FIG. 5) by reflow of the dielectric material 6.

Figure 5:
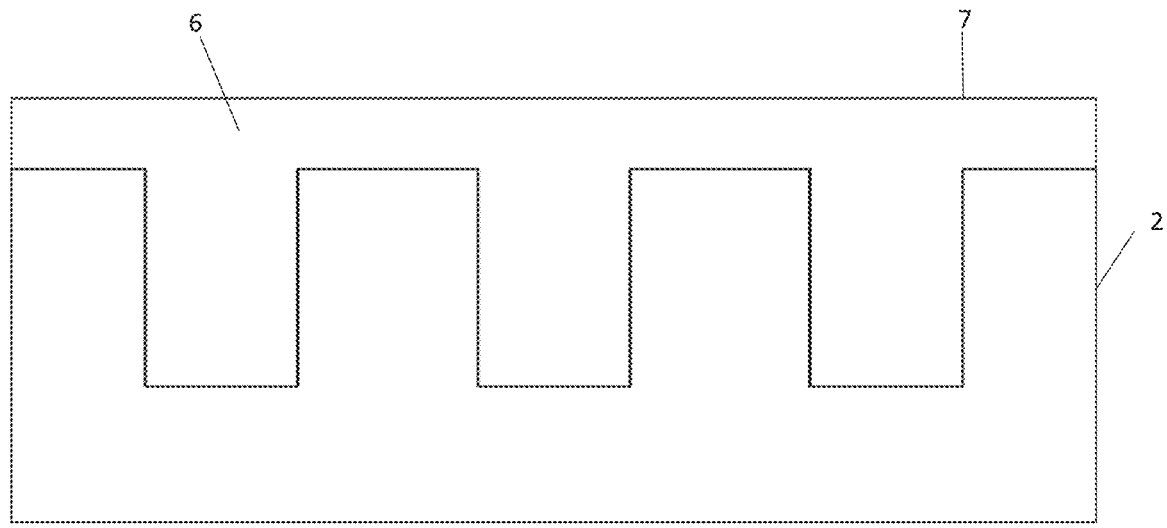
FIG. 5 illustrates the state of the surface following the second annealing/reflow of the stack of deposited reflowable dielectric.

FIG. 5 illustrates the state of the surface following the cycles of deposition of the dielectric material 6 followed by the reflows of the dielectric material 6. The result is that any voids 8 have been filled and the resulting surface 7 of the dielectric 6 is planar.

Figure 6:
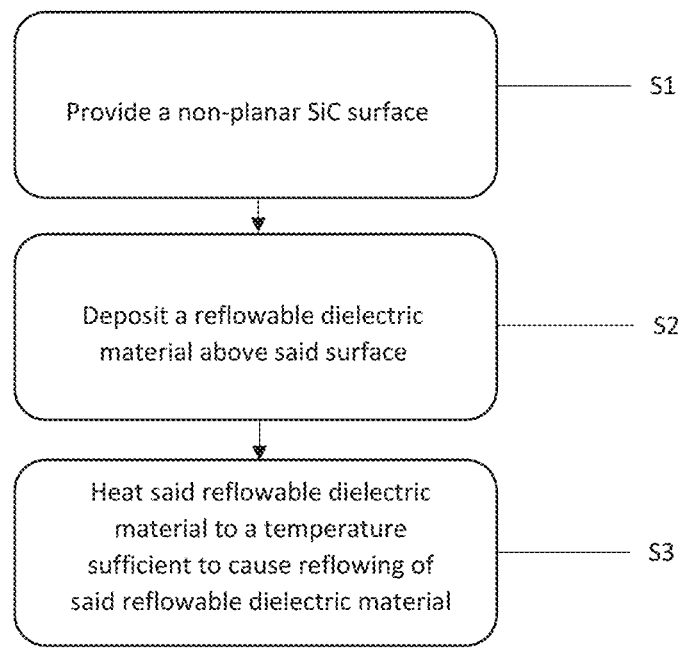
FIG. 6 shows steps in a method described.

FIG. 6 shows steps in the method described. These include a step of providing a non-planar SiC surface (step S1), a step of depositing a reflowable dielectric material above said surface (step S2), and a step of heating said reflowable dielectric material to a temperature sufficient to cause reflowing of said reflowable dielectric material (step S3).

Figure 7:
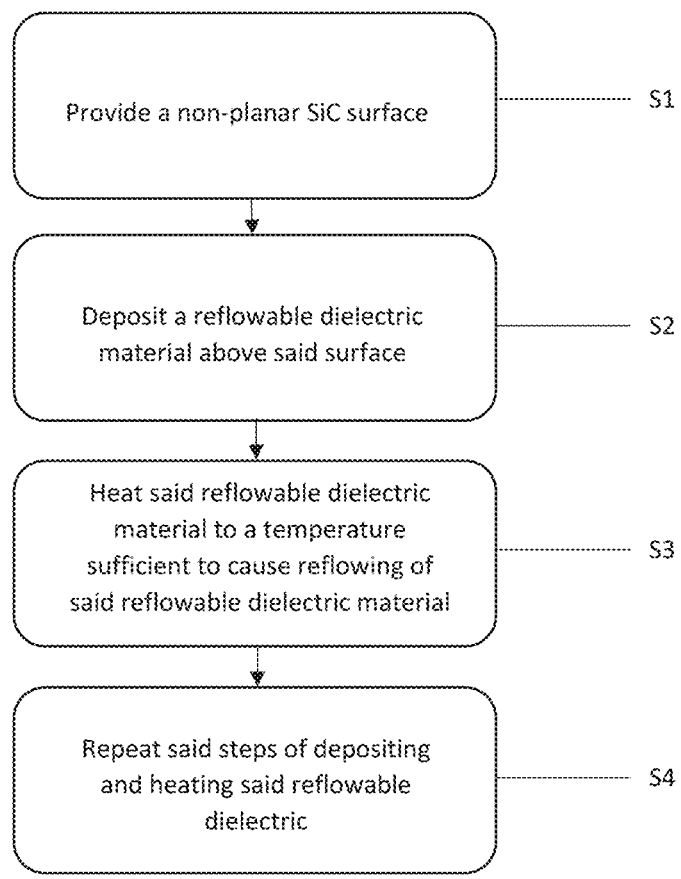
FIG. 7 shows steps in the method described, further incorporating repeating the steps of depositing and heating the reflowable dielectric.

FIG. 7 shows steps in the method described, including a further step of repeating said steps of depositing and heating said reflowable dielectric (step S4).

The described method allows the filling of an underlying topography with a dielectric film 6, and the creation of a planar dielectric film 6 atop a non-planar surface 3. Filling of spaces in a surface with a non-planar topography is a challenge due to the tendency of voids and seams to form during the deposition of a dielectric film, which remain present following deposition. Eliminating these voids and seams prevents the formation of non-uniform etch characteristics that voids and seams introduce into the film, and further prevents the tendency of voids to trap moisture which can lead to reliability issues. Creating a planar surface atop a non-planar surface has an effect on subsequent pattern levels. Planar surfaces allow for a greater depth of focus budget during photolithography relative to non-planar surfaces; this subsequently allows for the resolving of features during photolithography atop the planar surface that cannot be resolved on the non-planar surface.

These technical problems are solved through one or more cycles of depositing a reflowable dielectric, and then annealing the reflowable dielectric at a temperature sufficient to cause reflow. The reflowing of the dielectric results in the elimination of voids and seams, and causes the surface of the dielectric to become planar. Repeating this process in multiple cycles has been found to enhance the filling and planarizing effects of this method.

The embodiment of the method hitherto disclosed differs significantly from the chemical-mechanical-polishing (CMP) method. CMP is the current state-of-the-art technology for planarization in Si device manufacturing. CMP involves the deposition of a film to cover and fill the underlying topography, followed by polishing of the film to a planar state through chemical and mechanical processes.

An advantage of the method disclosed herein is its simplicity and its ability to be readily implemented with the processing equipment typically used for the fabrication of complementary metal-oxide-semiconductor (CMOS) technologies including legacy technology nodes. The capabilities required to implement the present invention are plasma-enhanced chemical vapour deposition (PECVD) deposition tools and furnaces. Fabrication sites tooled for legacy CMOS technology nodes do not typically possess CMP capability. Therefore, the present method achieves the goals of voidless and seamless filling and planarization without requiring the capital investment in CMP capability.

Figure 8:
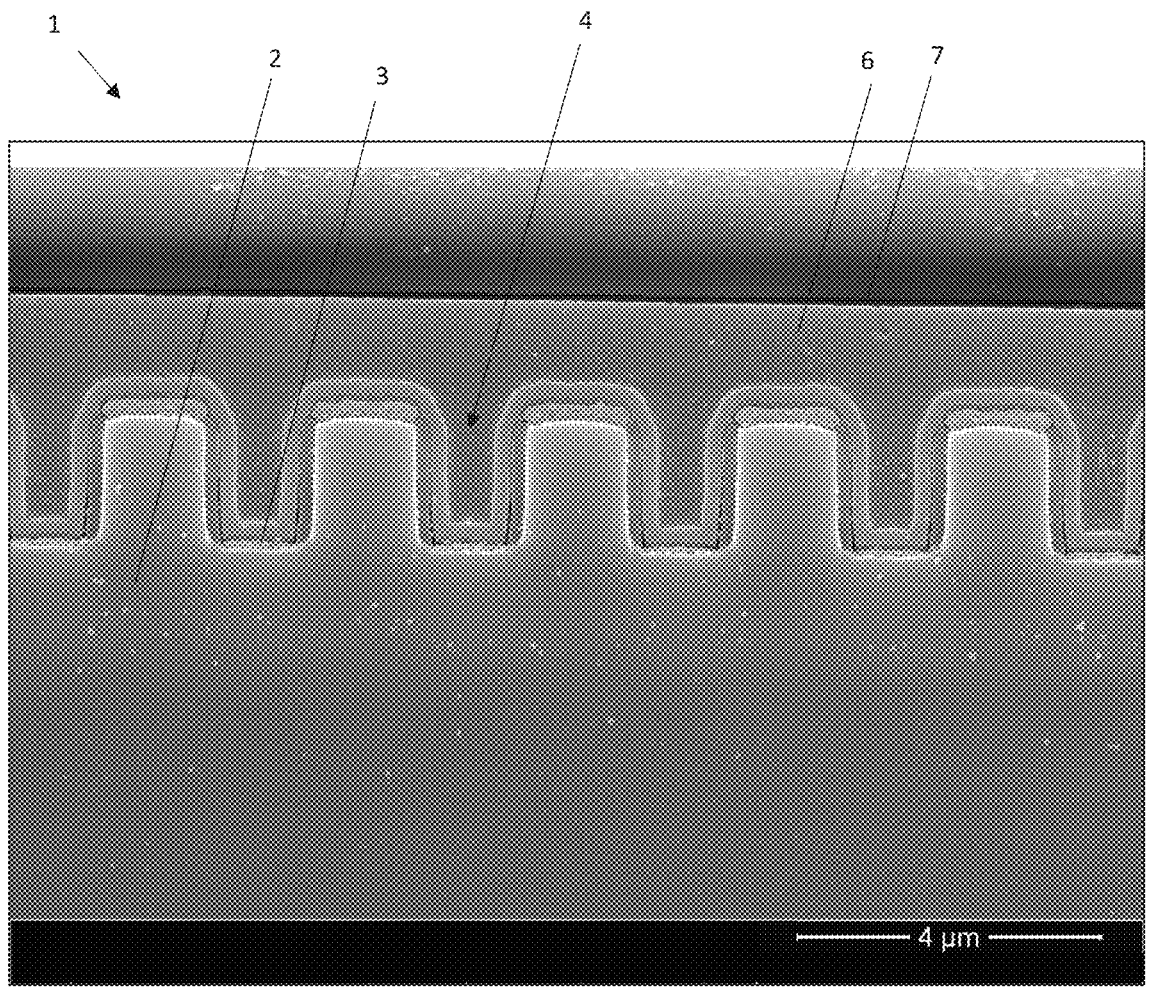
FIG. 8 shows a cross sectional image of a semiconductor structure following two cycles of BPSG (4 WT % Boron, 4 WT % Phosphorus) deposition and reflow at 950° C. for 30 minutes.

FIG. 8 shows a scanning electron microscope (SEM) cross section of a semiconductor structure of a SiC device according to an embodiment. The semiconductor structure 1 may be the semiconductor structure illustrated in FIG. 5. The same reference numerals have been used in different figures for similar or equivalent features to aid understanding and are not intended to limit the illustrated embodiments. The semiconductor structure 1 comprises a SiC substrate 2 having a non-planar upper surface 3, formed by trenches 4 in the SiC substrate 2. The semiconductor structure 1 was formed by two cycles of BPSG (4 WT % Boron, 4 WT % Phosphorus) deposition and reflow at 950° C. for 30 minutes.

FIGS. 9 to 13 illustrate schematic cross sections of a semiconductor structure 1 (such as power DMOS structure) at different stages in a manufacturing process according to another embodiment, in which the non-planar surface 9 comprises a conductive film 10 on a SiC substrate 2 having a planar surface 3.

Figure 9:
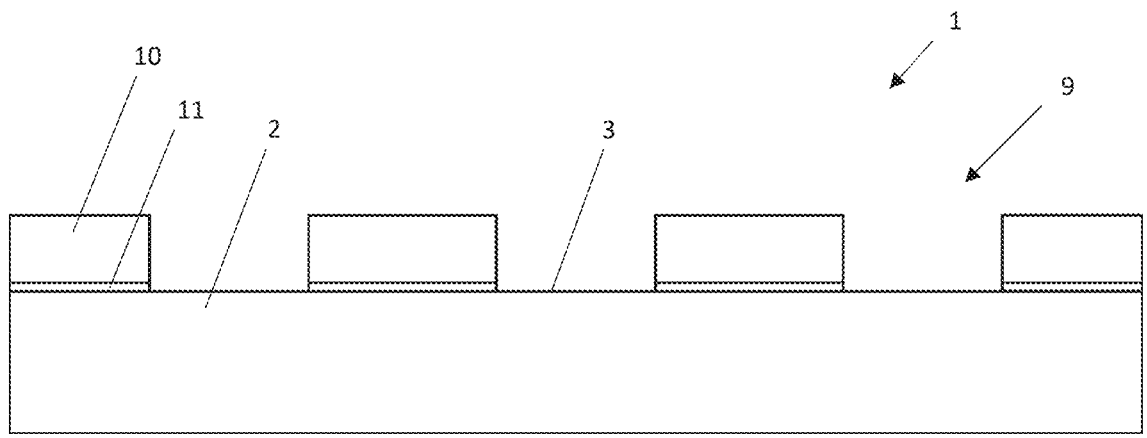
FIG. 9 shows a schematic cross sectional diagram of a general shape of the surface topography comprising a conductive film to be filled and planarized.

FIG. 9 shows the semiconductor structure 1 comprising a SiC substrate 2 having a planar upper surface 3, and a conductive film 10 separated from the SiC substrate by an insulating layer 11. The conductive film 10 is patterned and thereby provides a non-planar surface 9 together with the underlying SiC substrate 2.

Figure 10:
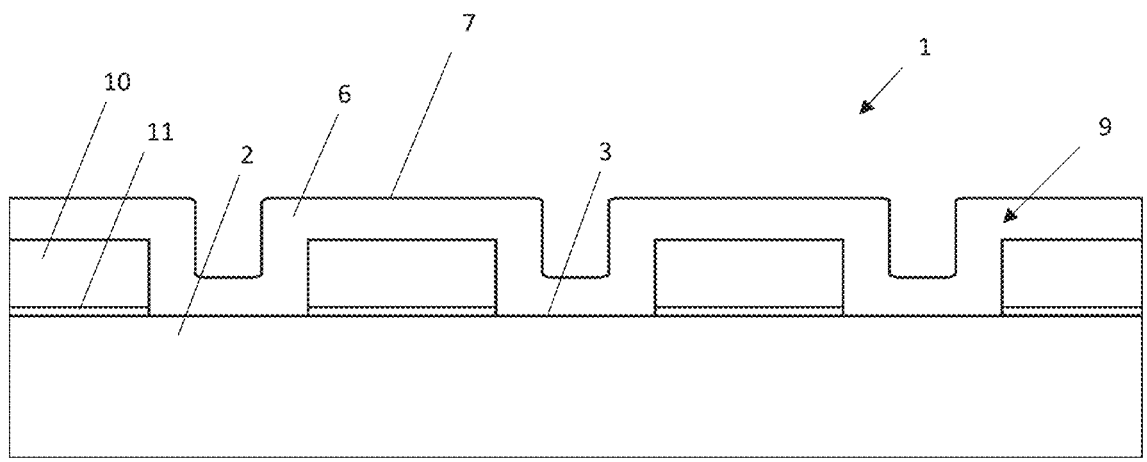
FIG. 10 illustrates the state of the surface after the first deposition of a reflowable dielectric atop the layer featuring topography.

FIG. 10 shows the semiconductor structure 1 after depositing a dielectric material 6 being BPSG on the non-planar surface 9. The deposition is conformal, and the resulting layer of dielectric material 6 has a non-planar upper surface 7, which substantially follows the shape of the underlying non-planar surface 9.

Figure 11:
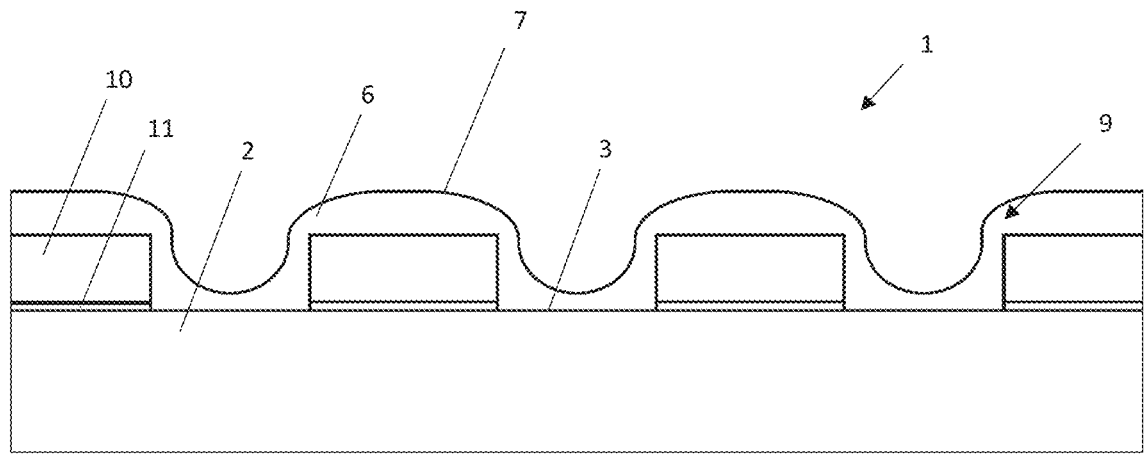
FIG. 11 illustrates the state of the surface after annealing/reflowing the first deposited layer of reflowable dielectric.

FIG. 11 shows the semiconductor structure 1 after heating/annealing to cause reflowing of the dielectric material 6. Due to the low diffusion coefficient of dopants in SiC (compared to Si), the SiC device properties do not significantly degrade.

Figure 12:
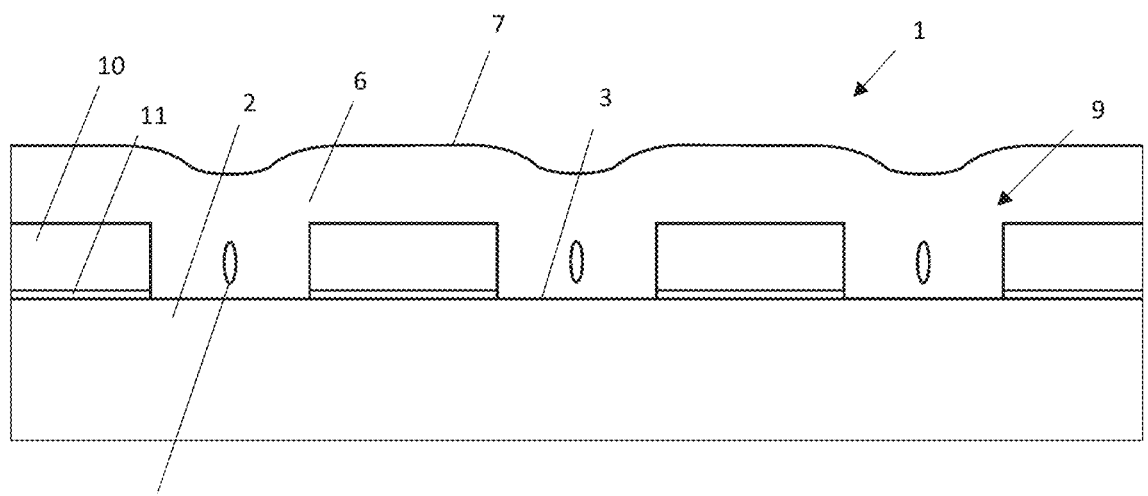
FIG. 12 illustrates the state of the surface after the second deposition of reflowable dielectric.

FIG. 12 shows the semiconductor structure 1 after depositing further dielectric material 6 being BPSG. Voids 8 are formed in the dielectric material 6. The upper surface 7 of the dielectric material 6 is not completely planar, but is located above the patterned conductive film 10.

Figure 13:
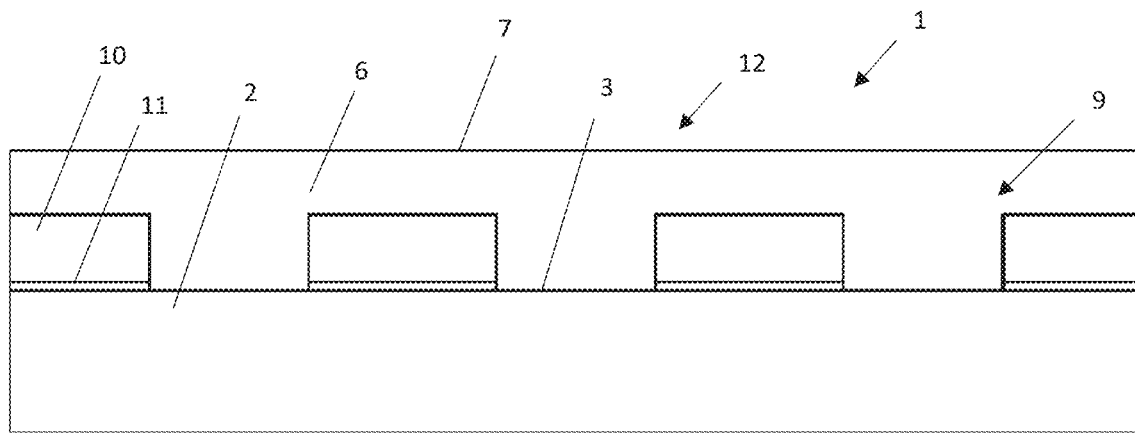
FIG. 13 illustrates the state of the surface after the second annealing/reflow of the deposited layer(s) of reflowable dielectric.

FIG. 13 shows the semiconductor structure 1 according to an embodiment, after heating/annealing to cause reflowing of the dielectric material 6. The semiconductor structure 1 now comprises a dielectric layer 12 (formed from the dielectric material 6) comprising a substantially planar surface 7. The dielectric layer 12 is substantially free of voids.

FIGS. 14 to 18 illustrate schematic cross sections of a semiconductor structure 1 at different stages in a manufacturing process according to a different embodiment, in which the non-planar surface 9 comprises a dielectric film 13 on a SiC substrate 2 having a planar surface 3.

Figure 14:
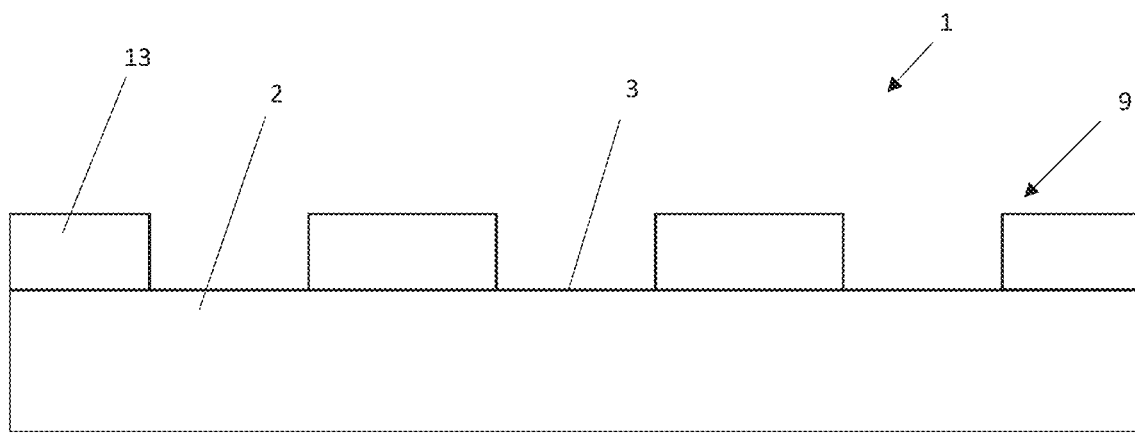
FIG. 14 shows a schematic cross sectional diagram of a general shape of the surface topography comprising a dielectric film to be filled and planarized.

FIG. 14 shows the semiconductor structure 1 comprising a SiC substrate 2 having a planar upper surface 3, and a dielectric film 13 directly on top of the SiC substrate 2. The dielectric film 13 is patterned and thereby provides a non-planar surface 9 together with the underlying SiC substrate 2.

Figure 15:
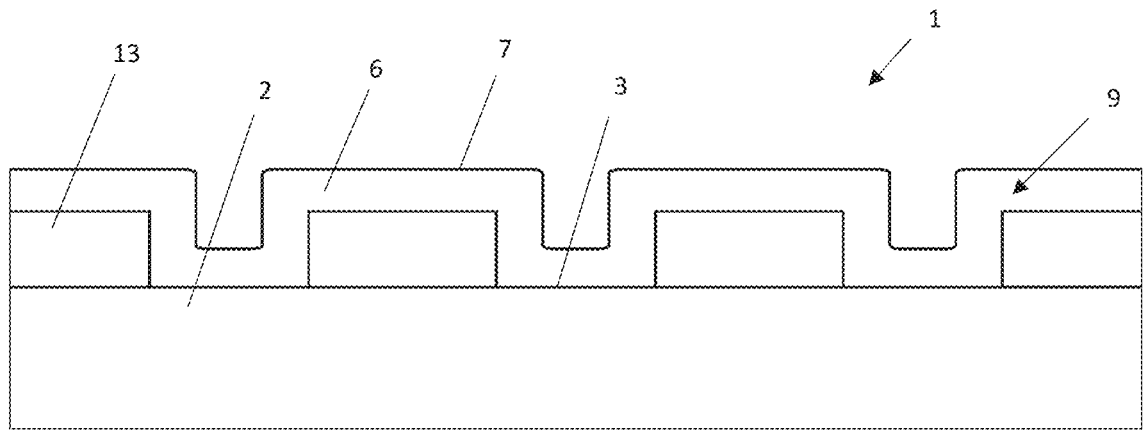
FIG. 15 illustrates the state of the surface after the first deposition of a reflowable dielectric atop the layer featuring topography.

FIG. 15 shows the semiconductor structure 1 after depositing a dielectric material 6 on the non-planar surface 9. The deposition is conformal; and the resulting layer of dielectric material 6 has a non-planar upper surface 7, which substantially follows the shape of the underlying non-planar surface 9.

Figure 16:
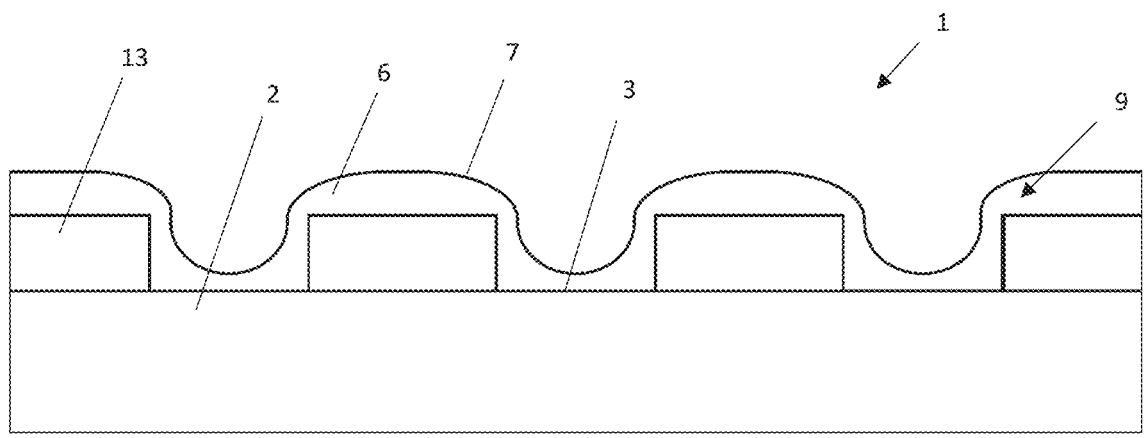
FIG. 16 illustrates the state of the surface after annealing/reflowing the first deposited layer of reflowable dielectric.

FIG. 16 shows the semiconductor structure 1 after heating/annealing to cause reflowing of the dielectric material 6. Importantly, the dielectric film 13 is not reflowable and therefore maintains its shape during heating. Due to the low diffusion coefficient of dopants in SiC (compared to Si), the SiC device properties do not significantly degrade.

Figure 17:
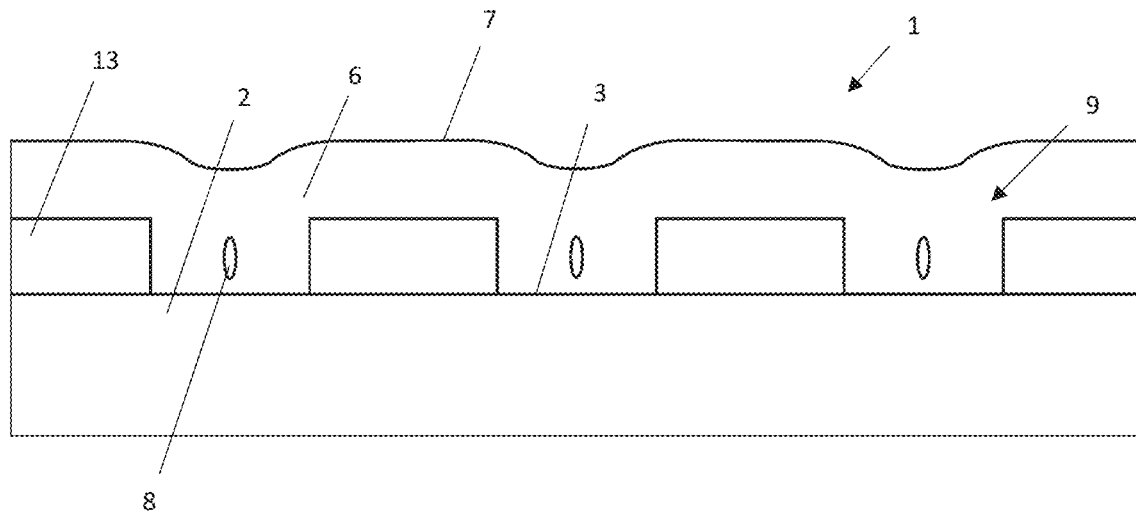
FIG. 17 illustrates the state of the surface after the second deposition of reflowable dielectric.

FIG. 17 shows the semiconductor structure 1 after depositing further dielectric material 6. Voids 8 are formed in the dielectric material 6. The upper surface 7 of the dielectric material 6 is not completely planar, but is located above the patterned dielectric film 13.

Figure 18:
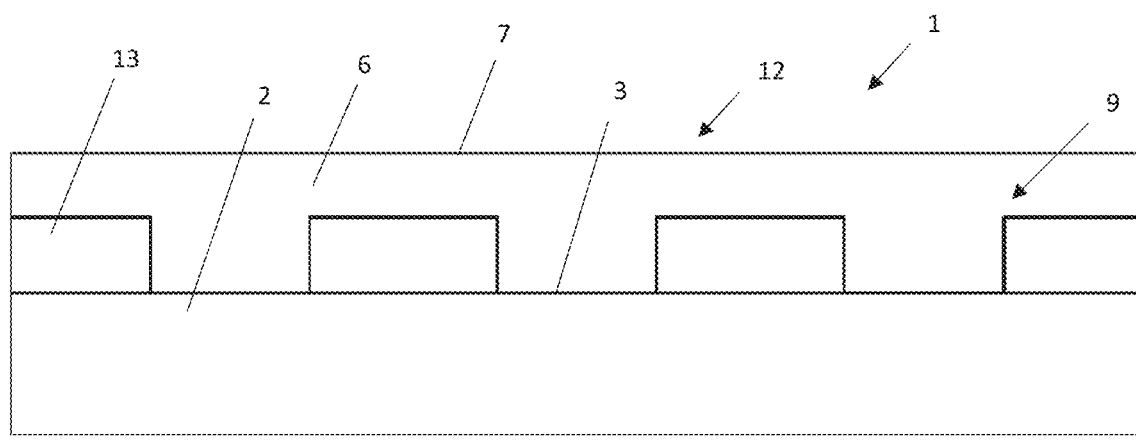
FIG. 18 illustrates the state of the surface after the second annealing/reflow of the deposited layer(s) of reflowable dielectric.

FIG. 18 shows the semiconductor structure 1 according to an embodiment, after a second step heating/annealing to cause reflowing of the dielectric material 6. The semiconductor structure 1 now comprises a dielectric layer 12 (formed from the dielectric material 6) comprising a substantially planar surface 7 above the non-planar surface 9 comprised by the dielectric film 13 and the underlying SiC substrate 2. The dielectric layer 12 is substantially free of voids.

In general, embodiments of the invention provide a method of forming a semiconductor structure. The method comprises providing a non-planar surface in the manufacturing of a silicon carbide (SiC) device, depositing a reflowable dielectric material (e.g. BPSG or PSG) on the non-planar surface, and then heating the reflowable dielectric material to cause reflowing of the reflowable dielectric material. The heating needs to be at a sufficient temperature and for a sufficient time to cause the reflowable dielectric material to reflow, and thereby provide a substantially void free and substantially planar dielectric layer. The method is typically performed in a CMOS process for manufacturing SiC devices.

The method typically comprises a plurality of the deposition steps and heating steps to cause reflowing (multiple cycles of reflowing). For example, the method may comprise depositing of a first layer of dielectric material and a first step of heating to cause reflowing of the first layer of dielectric material, followed by depositing a second layer of dielectric material directly on the first layer and then a second step of heating to cause reflowing of the second layer of dielectric material to thereby provide a void free dielectric layer with a planar top surface.

The non-planar surface may comprise one or more trenches in a SiC substrate. Typically, the non-planar surface comprises a non-planar topography created during SiC device processing. The non-planar surface may comprise a patterned conductive film or a patterned (non-reflowable) dielectric film on a an underlying SiC substrate (e.g. an epitaxial SiC layer). The SiC substrate may then be substantially planar. The conductive film may comprise one of WSi, Ti, TiW, Co, Cu, Mo, W, Ni, Pt, Ta, TaSi, TiSi, CoSi, PtSi. The dielectric film may comprise one of $SiO_2$, SiN, undoped Polysilicon, SiON.

The temperature (sufficient to cause reflow) may be in the range of 750° C. to 1350° C., and may for example be 950° C. The time of heating at or above that temperature may be in the range of 1 min to 24 h, but is typically about 30 min. The step of heating may comprise furnace heating or rapid-thermal process (RTP) heating.

The reflowable dielectric material may comprise Borophosphosilicate glass (BPSG), and the BPSG may comprise 0 to 12 WT % Boron, and 0.1 to 12 WT % Phosphorous. Alternatively, the reflowable dielectric material may comprise Phosphosilicate glass (PSG).

The step of depositing a dielectric material may comprise one of plasma-enhanced chemical vapor deposition (PECVD), low-pressure chemical vapor deposition (LPCVD), and atmospheric chemical vapor deposition (CVD).

Embodiments of the invention also provide a semiconductor structure. The semiconductor structure comprises a non-planar surface of a SiC device, and a dielectric layer above the surface, wherein an upper surface of the dielectric layer is substantially planar and wherein the dielectric layer is substantially free of voids. The non-planar surface may comprise a SiC substrate comprising at least one trench. The non-planar surface may comprise a planar SiC substrate and a patterned dielectric film located on said SiC substrate, or may comprise a planar SiC substrate and a patterned conductive film located on said SiC substrate. The upper surface of the dielectric layer may be substantially planar with a surface roughness of <50 nm RMS. The semiconductor structure is typically a semiconductor structure formed by an embodiment of the method described herein.

Each feature disclosed or illustrated in the present specification may be incorporated in the invention, whether alone or in any appropriate combination with any other feature disclosed or illustrated herein. In addition, whilst the attached claims have been drafted without multiple dependencies, it is within the scope of this disclosure to include claims with multiple dependencies, including all combinations of claimed features which are not incompatible with each other.

The invention claimed is:

1. A method of forming a silicon carbide (SiC) device, the method comprising:
   providing a non-planar surface in the manufacturing of the SiC device;
   depositing a reflowable dielectric material on said non-planar surface, wherein said non-planar surface comprises a patterned dielectric film on a SiC substrate, wherein said dielectric film is not reflowable;
   heating said reflowable dielectric material to a temperature in a range of 950° C. to 1350° C. and for a time sufficient to cause reflowing of said reflowable dielectric material;
   repeating depositing and heating to cause reflowing and thereby provide a dielectric layer comprising a planar surface above the non-planar surface comprised by the dielectric film and the underlying SiC substrate, wherein said dielectric layer is free of voids; and
   performing photolithography atop said planar surface formed by said reflowable dielectric material.

2. A method as in claim 1, wherein the non-planar surface comprises a non-planar topography created during SiC device processing.

3. A method as claimed in claim 1, wherein the reflowable dielectric material comprises Borophosphosilicate glass (BPSG).

4. A method as claimed in claim 3, wherein the BPSG comprises 0 to 12 WT % Boron, and 0.1 to 12 WT % Phosphorous.

5. A method as claimed in claim 1, wherein the reflowable dielectric material comprises Phosphosilicate glass (PSG).

6. A method as claimed in claim 1, wherein said step of depositing a dielectric material comprises plasma-enhanced chemical vapor deposition (PECVD).

7. A method as claimed in claim 1, wherein said step of depositing a dielectric material comprises low-pressure chemical vapor deposition (LPCVD), or atmospheric chemical vapor deposition (CVD).

8. A method as claimed in claim 1, wherein said step of heating said reflowable dielectric material includes heating said reflowable dielectric material for a period of time in the range of 1 minute and 24 hours.

9. A method as claimed in claim 8, wherein said step of heating comprises furnace heating or rapid-thermal process (RTP) heating.

* * * * *